(12) United States Patent
Horak et al.

(10) Patent No.: US 7,289,864 B2
(45) Date of Patent: Oct. 30, 2007

(54) FEATURE DIMENSION DEVIATION CORRECTION SYSTEM, METHOD AND PROGRAM PRODUCT

(75) Inventors: David V. Horak, Essex Junction, VT (US); Wesley C. Natzle, New Paltz, NY (US); Merritt L. Funk, Austin, TX (US); Kevin J. Lally, Austin, TX (US); Daniel Prager, Hopewell Junction, NY (US)

(73) Assignees: International Business Machines Corporation, Armonk, NY (US); Tokyo Electron Limited, Tokyo (JP)

( * ) Notice: Subject to any disclaimer, the term of this patent is extended or adjusted under 35 U.S.C. 154(b) by 505 days.

(21) Appl. No.: 10/710,447

(22) Filed: Jul. 12, 2004

(65) Prior Publication Data

US 2006/0007453 A1    Jan. 12, 2006

(51) Int. Cl.
*G06F 19/00* (2006.01)
(52) U.S. Cl. .................. 700/121; 356/625; 438/14; 700/110
(58) Field of Classification Search .................. 438/14; 118/719, 696, 698; 156/345.24, 345.31, 156/345.32; 700/121, 125, 108, 109, 110
See application file for complete search history.

(56) References Cited

U.S. PATENT DOCUMENTS

| | | | |
|---|---|---|---|
| 5,739,909 A | | 4/1998 | Blayo et al. |
| 6,483,938 B1 * | | 11/2002 | Hennessey et al. ......... 382/149 |
| 6,587,744 B1 * | | 7/2003 | Stoddard et al. ............ 700/121 |
| 6,614,540 B1 | | 9/2003 | Stirton |
| 6,625,497 B2 | | 9/2003 | Fairbairn et al. |
| 6,639,663 B1 | | 10/2003 | Markle et al. |
| 6,643,008 B1 | | 11/2003 | Stirton et al. |
| 6,701,206 B1 | | 3/2004 | Markle et al. |
| 6,707,562 B1 | | 3/2004 | Lensing |
| 6,727,108 B2 | | 4/2004 | Eriguchi et al. |
| 6,889,113 B2 * | | 5/2005 | Tasker et al. ............... 700/180 |

(Continued)

OTHER PUBLICATIONS

Baum, C.C. et al., "Scatterometry for Post-Etch Polysilicon Gate Metrology," Proceedings of the SPIE—The International Society of Optical Engineering Conference, vol. 3677, Pt. 1-2, pp. 148-158.
Al-Assaad, R.M. et al., "Profile Parameter Accuracy Determined from Scatterometric Measurements," Proceedings of the SPIE—The International Society of Optical Engineering Conference, vol. 4692, pp. 17-28.

(Continued)

*Primary Examiner*—Michael D. Masinick
(74) *Attorney, Agent, or Firm*—Joseph Petrokaitis; Hoffman, Warnick & D'Alessandro LLC

(57) ABSTRACT

A system, method and program product for correcting a deviation of a dimension of a feature from a target in a semiconductor process, are disclosed. The invention determines an origin of a deviation in a feature dimension from a target dimension regardless of whether it is based on processing or metrology. Adjustments for wafer processing variation of previous process tools can be fed forward, and adjustments for the process and/or integrated metrology tools may be fed back automatically during the processing of semiconductor wafers. The invention implements process reference wafers to determine the origin in one mode, and measurement reference wafers to determine the origin of deviations in another mode.

30 Claims, 6 Drawing Sheets

U.S. PATENT DOCUMENTS 6,975,974 B2 * 12/2005 Chien et al. .................... 703/2
7,116,817 B2 * 10/2006 Tanaka et al. ............... 382/149
2002/0155629 A1 * 10/2002 Fairbairn et al. ............. 438/14
2004/0005507 A1    1/2004 Lakkapragada et al.
2005/0235246 A1 * 10/2005 Smith et al. .................. 716/21
2007/0101305 A1 *  5/2007 Smith et al. ................... 716/8

OTHER PUBLICATIONS

Drege, Emmanuel M. et al., "Linearized Inversion of Scatterometric Data to Obtain Surface Profile Information," Optical Engineering, vol. 41, No. 1, pp. 225-236.

* cited by examiner

FEATURE DIMENSION DEVIATION CORRECTION SYSTEM, METHOD AND PROGRAM PRODUCT

BACKGROUND OF INVENTION

The present invention relates generally to semiconductor processing tools, and more particularly, to a feature dimension deviation correction system, method and program product.

The use of feedback controllers in semiconductor processing has long been established in the fabrication of semiconductor integrated circuits by semiconductor manufacturing facilities. Until recently, wafers were treated as a batch or a lot and the same processing was performed on each of the wafers in the lot. The size of the lot varies depending on the manufacturing practices of the facility, but is typically limited to a maximum of twenty-five wafers. Measurements are routinely made on a few wafers in the lot after processing and adjustments made to the next lot to be processed based on these sample measurements. This method of control based on sample measurements on the lot and process recipe adjustments for the following lots is called lot-to-lot control (L2L). The process models and information necessary to modify the process recipes for L2L control are stored, and the computations are performed at the facility level.

Recently manufacturers of semiconductor processing equipment (SPE) have included the ability to measure each wafer immediately before and after the processing is performed. In particular, processing chambers are provided with integrated metrology tools such as those that implement scatterometry. Hence, the capability to measure each wafer on the same tool used for processing is called integrated metrology (IM). IM, in turn, allows measurement and feed-forward or feedback adjustments at the wafer-to-wafer (W2W) level, or after the lot completes (i.e., L2L), or some variation in updating between W2W and L2L control. Conventional approaches, however, suffer from a number of drawbacks. First, current IM tools are typically optically-based, e.g., scatterometry-based, tools can be sensitive to deviations in underlying film thicknesses, which can change over time, between and within lots, and even across a wafer.

Second, conventional approaches assume any deviation from a target dimension is based on the process or processing tool that generates the feature. That is, conventional approaches assume measurements and measurement calibrations are correct, and do not determine the origin of any deviation of a feature's dimension from a target dimension. As a result, adjustments are typically applied only to the process tool that generated the feature, and upstream errors that are not detected by the pre-process IM tools are overlooked. In addition, calibration traditionally has been applied to external standard reference metrology measurement equipment, not IM tools. This type of calibration is static and does not compensate for drifts in IM tools, or in deviations of optical, physical or electrical properties between wafers and lots that may occur during processing and influence the IM measurement. For instance, U.S. Pat. No. 6,625,497 to Fairbarn et al. provides a processing module with integrated feedback and feed-forward metrology, but which uses a static measurement calibration, performed once prior to usage.

In reality, it is important to separate process equipment deviations, wafer state properties deviations and metrology deviations so that the correct adjustment can be made. Deviations in incoming wafer state can come from product differences, material changes, previous process equipment deviations in processing, and across wafer uniformity changes. Changes in wafer state can directly impact the result of a static process, or the process itself can vary. Metrology deviations might come from hardware replacement or differences between metrology tools. Current methods of feed forward and feedback L2L and W2W control make adjustments for processing deviations only, without separating the process equipment deviations, wafer state properties deviations and the metrology deviations.

Conventional methods have also not adjusted and improved to accommodate the advent of new optical IM techniques. Critical dimension (CD) scanning electron microscopy (SEM) measurements, primarily sensitive to the surface of a substrate, are a fundamentally different type of measurement method from the optical integrated metrology (IM), which can sense underlying materials as well. Although it is difficult to use the slow CDSEM metrology measurement for wafer-to-wafer control, usage of these tools may allow valuable information to be used by the IM to improve the accuracy and confidence of the measurements, even while the CDSEM measurements are only taken on a sample bases.

In addition to IM, processing tools used in the semiconductor industry, in general, have become complex processing systems including a number of process modules and integrated control systems. However, efficient usage of these features for tailored control and optimization of segments of the process sequence on a lot-to-lot basis and on a wafer-to-wafer basis has not been fully achieved. In particular, because of the high volume of data collected and short period of time between the measurements and subsequent processing of the wafer, it is necessary to provide the ability to perform wafer-to-wafer (W2W) control at the tool rather than at the facility level. Yet, this ability has not been implemented. For example, as noted above, feedback corrections are generally applied on a L2L basis with wafers within the lot all receiving the same correction. Since upstream process variations can be caused by the lack of tool-to-tool or module-to-module matching, reticle differences, chemical batch changes and simple process drifts, the feedback correction of incoming lots from a defined thread of tools is often set to equal to an Exponentially Weighted Moving Average (EWMA) of the lot deviation. Unfortunately, it can be difficult to track and control these threads of tools. With W2W measurements, an EWMA-based feedback is no longer optimum. Another shortcoming of current IM processing tools is that they have not been integrated with facility processing systems, which control multiple processing tools, measurement tools and control systems within the overall facility.

In view of the foregoing, there is a need in the art for a way to address the problems of the related art.

SUMMARY OF INVENTION

The invention includes a system, method and program product for correcting a deviation of a dimension of a feature from a target in a semiconductor process. The invention determines an origin of a deviation in a feature dimension from a target dimension regardless of whether it is based on processing or metrology. Adjustments for wafer processing variation of previous process tools can be fed forward, and adjustments for the process and/or integrated metrology tools may be fed back automatically during the processing of semiconductor wafers. The invention implements process reference wafers to determine the origin in one mode, and measurement reference wafers to determine the origin of deviations in another mode. The invention addresses, inter alia, the problems of the related art.

A first aspect is directed to a method for correcting a deviation of a dimension of a feature from a target in a semiconductor process, the method comprising the steps of: first measuring the feature prior to conducting a process relative to the feature to obtain an incoming feature dimension; conducting the process based on a process model; second measuring the feature after conducting the process to obtain an outgoing feature dimension; determining an origin of any deviation of the outgoing feature dimension from a target structure dimension; and adjusting, according to the origin, at least one of the measuring steps and the process conducting step to correct for any deviation.

A second aspect of the invention is directed to a system for correcting a deviation of a dimension of a feature from a target in a semiconductor process, the system comprising: means for first measuring the feature prior to conducting a process relative to the feature to obtain an incoming feature dimension; means for conducting the process based on a process model; means for second measuring the feature after conducting the process to obtain an outgoing feature dimension; means for determining an origin of any deviation of the outgoing feature dimension from a target structure dimension; and means for adjusting, according to the origin, at least one of the measuring means and the process conducting means to correct for any deviation.

A third aspect of the invention provides a computer program product comprising a computer useable medium having computer readable program code embodied therein for correcting a deviation of a dimension of a feature from a target in a semiconductor process, the program product comprising: program code configured to control means for first measuring the feature prior to conducting a process relative to the feature to obtain an incoming feature dimension; program code configured to control a processing tool that conducts the process based on a process model; program code configured to control means for second measuring the feature after conducting the process to obtain an outgoing feature dimension; program code configured to determine an origin of any deviation of the outgoing feature dimension from a target structure dimension; and program code configured to generate an adjustment, according to the origin, for at least one of the measuring means and the processing tool to correct for any deviation.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein.

DETAILED DESCRIPTION

For purposes of clarity only, the description includes the following sub-titles: I. Definitions; II. Processing System Environment; III. Correction System Overview; IV. Operational Methodology; V. Determination of Deviation Origin; VI. Miscellany; and VII. Conclusion.

I. Definitions

As used herein, the following terms have the following meanings: "Feature dimension" is a single dimension such as a critical dimension (CD), or many dimensions that describe a complete profile of a structure on a wafer, at a pre-processing stage. For example, the feature dimension can include several dimensions, limits and ranges for operation. A feature dimension can be an actual structure to be included in a chip or, more typically, a processing structure such as a photoresist that when processed results in another desired structure.

"Target structure dimension" is a single desired dimension of a structure of the wafer such as a critical dimension (CD), or many desired dimensions that describe a complete profile of a structure on a wafer, after a particular processing is complete. For example, the target dimension can include several dimensions, limits and ranges for operation. A target dimension is typically of an actual structure to be included in the chip, but, in some circumstances, could be a processing structure such as a photoresist.

"Incoming feature dimension" is a feature dimension as measured by a pre-processing integrated metrology tool, e.g., a photoresist feature. During the process that follows, the feature will be affected by dimension-changing process activities.

"Masking feature dimension" is a feature dimension that the process requires to generate the target dimension despite the dimension-changing actions of the process. In operation, the masking feature dimension should "coordinate" with the incoming feature dimension, meaning that the incoming feature dimension is sized such that any dimension-changing activities of the process that affects the dimension will be accommodated, i.e., a correction will be fed back for the incoming feature to be re-sized to accommodate the effects of the process. For example, if the process is known to result in a 2 nm discrepancy in a mask, an incoming mask feature should re-sized by 2 nm appropriately such that its incoming feature dimension is different by 2 nm.

"Outgoing structure dimension" is a single desired dimension of a structure of the wafer such as a critical dimension (CD), or many desired dimensions that describe a complete profile of a structure on a wafer, as measured by a post-processing integrated metrology tool.

Figure 1:
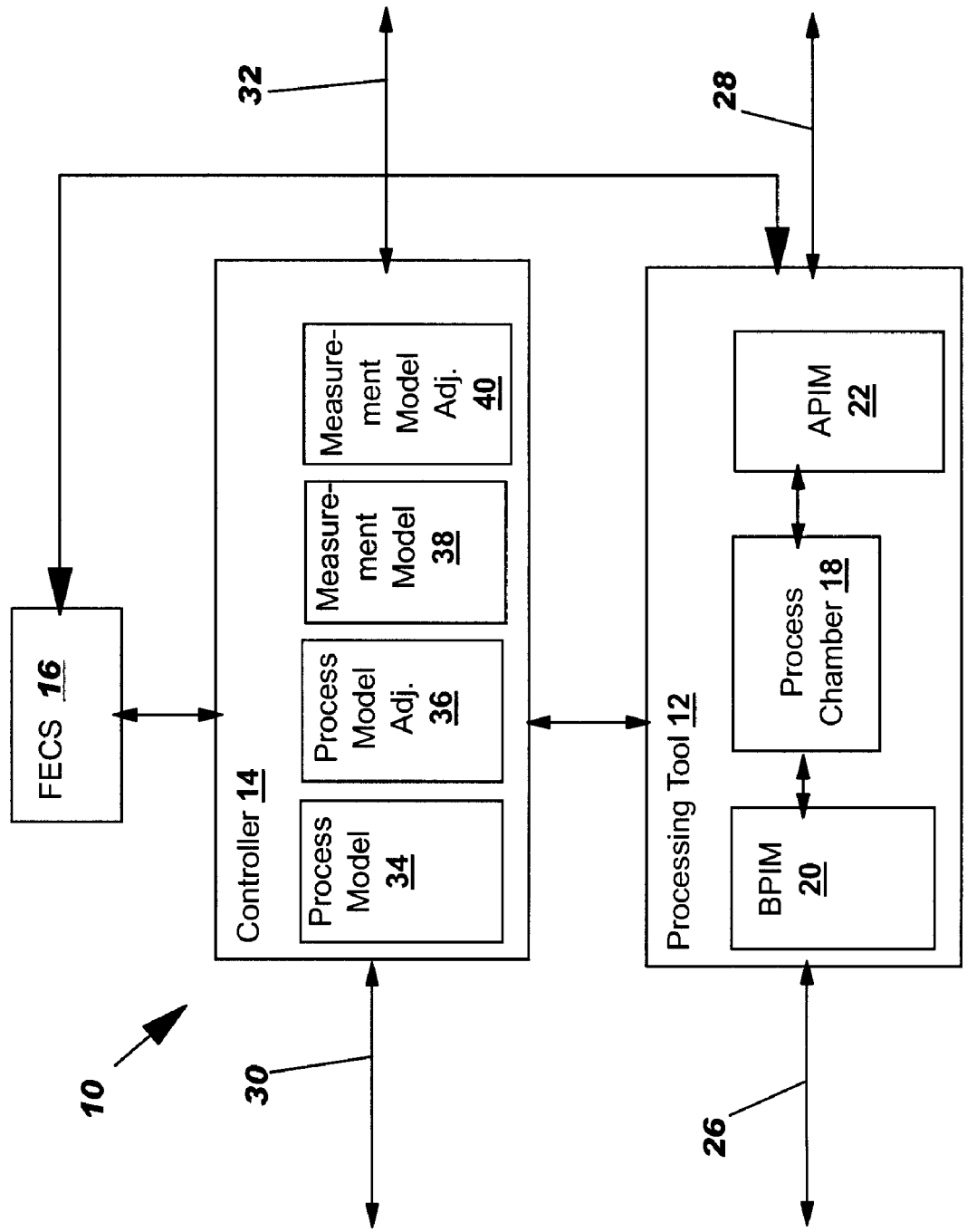
FIG. 1 shows an illustrative block diagram of a wafer processing environment in accordance with an embodiment of the present invention.

II. Processing System Environment:

FIG. 1 shows an illustrative block diagram of a processing system environment 10 in accordance with an embodiment of the present invention. It should be recognized that while a particular environment will be described, the teachings of the invention are applicable to a variety of different environments. In the illustrated embodiment, a processing tool 12 is provided, and a controller 14 is coupled to processing tool 12. A facility equipment control system (FECS) 16 is coupled to controller 14. Processing tool 12 includes at least one process chamber 18 and at least one integrated metrology tool. In the illustration, processing tool 12 includes a before-processing integrated metrology tool (BPIM) 20 and an after-processing integrated metrology tool (APIM) 22. Where only a single IM is provided, pre-process and post-process measurements can be obtained by the same tool. Currently IMs are typically optically (scatterometry) based tools. However, IMs 20, 22 may be any know known or later developed measurement tools. It should also be recognized that while BPIM 20 and APIM 22 are illustrated as integrated metrology tools, the invention may be applied where at least one of these tools is a standalone metrology tool.

Some setup and/or configuration information can be obtained by processing tool 12 and/or controller 14 from FECS 16. Factory level business rules can be used to establish a control hierarchy. For example, processing tool 12 and/or controller 14 can operate independently, or can be controlled to some degree by FECS 16. In addition, factory level business rules can be used to determine when a process is paused and/or stopped, and what is done when a process is paused and/or stopped. In addition, factory level business rules can be used to determine when to change a process and how to change the process. As is conventional, business rules can be used to specify the action taken for normal processing and the actions taken on exceptional conditions. Graphical user interfaces (GUI) screens can be used for defining and maintaining the business rules. Actions other than business rules can include, for example: initial model loading, pre-etch metrology data filtering, controller recipe selection, post-etch metrology data filtering, feedback calculation, a model update, etc.

FECS 16 can monitor some environment 10 processes using data reported from databases (not shown) associated with processing tool 12 and/or controller 14. Factory level business rules can be used to determine which processes are monitored and which data is used. For example, processing tool 12 and/or controller 14 can independently collect data, or data can be collected by FECS 16. In addition, factory level business rules can be used to determine how to manage the data when a process is changed, paused, and/or stopped. In addition, FECS 16 can provide run-time configuration information to processing tool 12 and/or controller 14. For example, automated process control (APC) settings, targets, limits, rules, and algorithms can be downloaded from FECS 16 to processing tool 12 and/or controller 14 as an "APC recipe," an "APC system rule," and "APC recipe parameters" at run-time.

Some setup and/or configuration information can be determined by processing tool 12 and/or controller 14 when they are initially configured by the system. System level business rules (system rules) can be used to establish a control hierarchy. For example, processing tool 12 and/or controller 14 can operate independently, or processing tool 12 can be controlled to some degree by controller 14. In addition, system rules can be used to determine when a process is paused and/or stopped, and what is done when a process is paused and/or stopped. In addition, system rules can be used to determine when to change a process and how to change the process. Furthermore, controller 14 can use tool level rules to control some tool level operations.

Processing tool 12 and/or controller 14 can exchange information with FECS 16. In addition, FECS 16 can send command and/or override information to processing tool 12 and/or controller 14. For example, FECS 16 can feed-forward to processing tool 12 and/or controller 14 down-loadable recipes for any number of process modules, tools, and measuring devices, with variable parameters for each recipe. Variable parameters can include final critical dimension (CD) targets, limits, offsets, and variables in the tool level system that needs to be adjustable by lot. In addition, factory lithography CD metrology data can be fed-forward to controller 14. Furthermore, FECS 16 can be used to provide measurement data, such as CD SEM information, to controller 14. Alternatively, the CD SEM information can be provided manually.

In FIG. 1, one processing tool 12, and one controller 14 are shown, but this configuration is not required for the invention. Environment 10 can comprise any number of processing tools having any number of controllers associated with them in addition to independent process tools and modules. Processing tool 12 and/or controller 14 can be used to configure any number of included subcomponents associated with them in addition to any number of independent process tools and modules. For example, processing tool 12 can include any number of subcomponents such as an etch module, a deposition module, a polishing module, a coating module, a developing module, a thermal treatment module, etc. Processing tool 12 and/or controller 14 can collect, provide, process, store, and display data from processes involving processing tools, processing subsystems, process modules, and sensors. Alternatively, controller 14 can support other processing tools, and include additional controllers such as a run-to-run (R2R) controller, a feed-forward (FF) controller, process model controller, feedback (FB) controller, a process controller, a measurement adjuster or a combination of two or more thereof.

Processing tool 12 also includes links 26, 28 for coupling to at least one other processing tool and/or controller (not shown). For example, other processing tools and/or controllers can be associated with a process that has been performed before processing tool 12, and/or other controllers can be associated with a process that is performed after this processing tool 12. Link 26 and link 28 can be used to feed forward and/or feed back information. For example, feed forward information can comprise data associated with an in-coming wafer. This data may include, for example, lot data, batch data, run data, composition data, and wafer history data. Processing tool 12 operates under instructions from controller 14.

Controller 14 includes a process model 34 that instructs processing tool 12 how to conduct a particular process. A "process model" may be any equation that relates a desired change to a recipe parameter(s) of the processing needed to achieve the target structure dimension from a feature dimension. A process model can be, for example, a simple linear equation with one input and one output, i.e., a single input, single output (SISO), or a complex mathematical model using many inputs and creating many outputs, i.e., multi input, multi output (MIMO). For an example of a critical dimension (CD) control system, a process model converts a trim amount to a process recipe parameter set (for processing tool 12) to achieve that trim amount. A "recipe parameter" to processing tool 12 can be any instruction that processing tool 12 can implement, e.g., a pressure, process time, gas composition, temperature, flow of a single gas in a complex composition, etc. A process model adjustment 36 may also be available at controller 14, as will be described in greater detail below.

Controller 14 also includes a measurement model 38 that instructs processing tool 12, and in particular, BPIM 20 and/or APIM 22, how to conduct a measurement. For example, a photoresist feature may be measured by an integrated metrology tool, i.e., by BPIM 20, which collects raw data and turns that raw data into an incoming feature dimension based on measurement model 38. This 'measurement process' is inherently very different from the process that takes the incoming feature (resist) dimension and transfers it into an underlying material. The edges sensed by the metrology may or may not coincide exactly with the feature edges and dimensions relevant for the process and pattern transfer. Therefore, the incoming feature dimension as measured by the 'measurement process' may not actually result in a masking feature dimension of the same size when acted upon by the process used to transfer the pattern. For instance, a measurement problem could cause a difference between "measured" and "masking" feature dimensions. Alternatively, changes in wafer state can directly impact the CD determined by measurement (such as when the measurement is impacted by a change in edge slope or change in underlying material) and can thus cause a difference between the measured (incoming) feature dimension and the masking feature dimension. As will be described below, the invention can detect this difference and correct for this difference. Deviations in an outgoing structure dimension are correctly attributed to the difference between measured (incoming) feature dimension and masking feature dimension when this is the origin, and deviations are correctly attributed to process deviations when the process is the origin. A measurement model adjustment 40 is available in controller 14, as will be described in further detail below.

Controller 14 can also include links 30, 32 for coupling to at least one other controller. For example, other controllers can be associated with a process that has been performed before this process, and/or other controllers can be associated with a process that is performed after this process. Links 30, 32 can be used to feed forward and/or feed back information. For example, controller 14 can use the difference between a measured critical dimension (hereinafter "CD") of the incoming material (input state) and a target critical dimension (desired state) to predict, select, or calculate a set of process parameters to achieve a desired process result that is changing the state of the wafer from the input state to the desired state. For example, this predicted set of process parameters can be a first estimate of a recipe to use based on an input state and a desired state. In one embodiment, data such the input state and/or the desired state data can be obtained from a host. In one case, controller 14 knows the input state and a model equation for the desired state for the wafer, and the controller determines a set of recipes that can be performed on the wafer to change the wafer from the input state to a processed state. For example, the set of recipes can describe a multi-step process involving a set of process modules.

Controller 14 can compute a predicted state for the wafer based on the input state, the process characteristics, and a process model. For example, a trim rate model can be used along with a processing time to compute a predicted trim amount. Alternately, an etch rate model can be used along with a processing time to compute an etch depth, and a deposition rate model can be used along with a processing time to compute a deposition thickness. In addition, models can include SPC charts, PLS models, PCA models, Fitness Distance Correlation (FDC) models, and Multivariate Analysis (MVA) models.

Environment 10 can also comprise an APC system such as that available from Tokyo Electron Ltd. that can include a Unity Tool®, Telius®Tool, and/or a Trias®Tool and their associated processing subsystems and process modules. In addition, environment 10 can comprise a run-to-run (R2R) controller, such as the Ingenio®TL ES server from TEL, and an integrated metrology module (IMM) from TEL. Environment 10 may also include module related measurement devices, tool-related measurement devices, and external measurement devices. For example, data can be obtained from sensors coupled to one or more process modules and sensors coupled to processing tool 12. In addition, data can be obtained from an external device such as a scanning electron microscope (SEM) tool and an Optical Digital Profiling (ODP) tool. An ODP tool is available for Timbre Technologies Inc. (a TEL company) that provides a patented technique for measuring the profile of a feature in a semiconductor device. For example, ODP techniques can be used to obtain critical dimension (CD) information, feature profile information, or via profile information.

Figure 2:
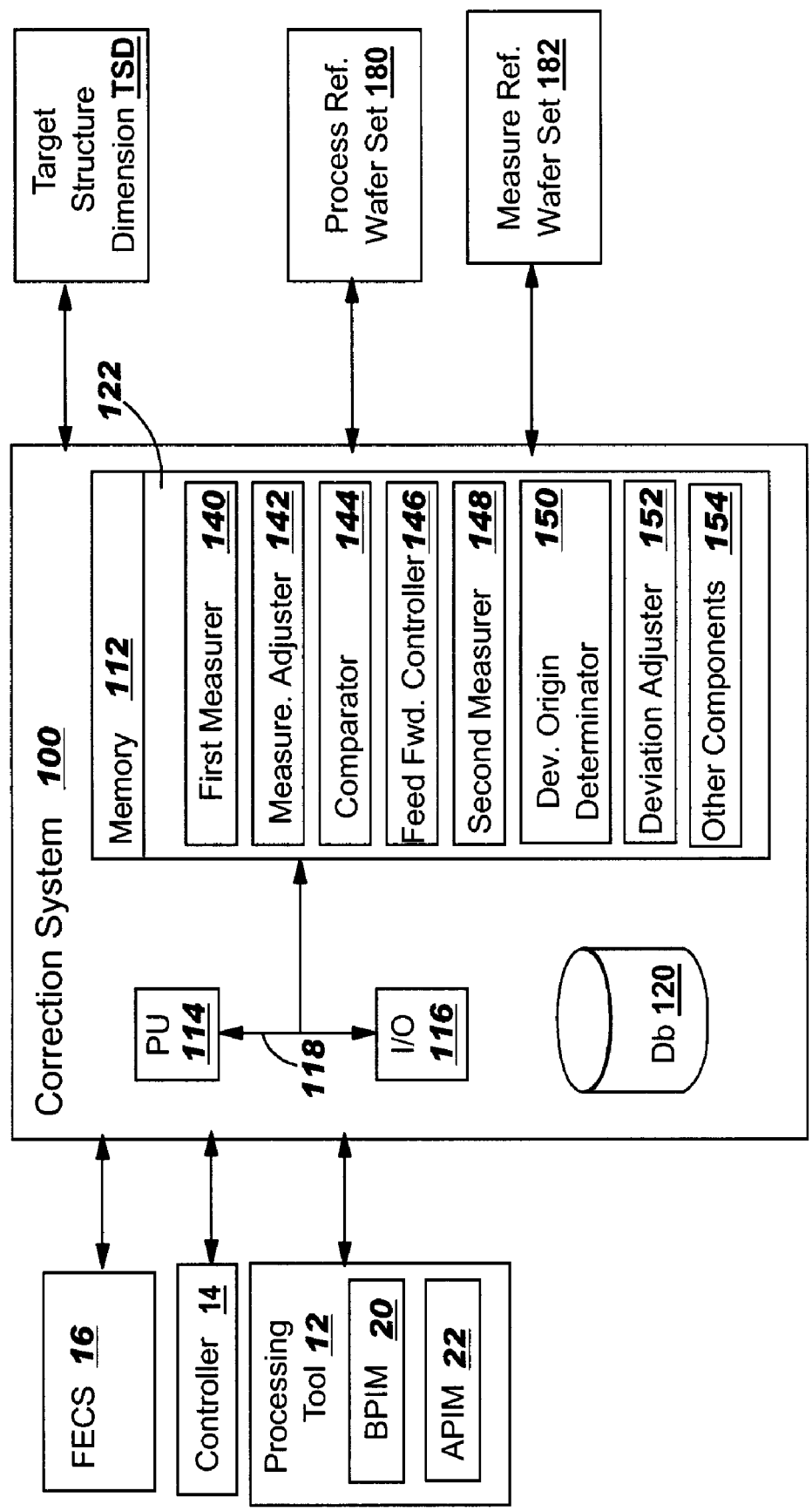
FIG. 2 shows a simplified block diagram of a correction system in accordance with an embodiment of the present invention.

III. Correction System Overview:

Turning to FIG. 2, a block diagram of a correction system 100 in accordance with the invention is shown. Correction system 100 includes a memory 112, a processing unit (PU) 114, input/output devices (I/O) 116 and a bus 118. A database 120 may also be provided for storage of data relative to processing tasks. Memory 112 includes a program product 122 that, when executed by PU 114, comprises various functional capabilities described in further detail below. Memory 112 (and database 120) may comprise any known type of data storage system and/or transmission media, including magnetic media, optical media, random access memory (RAM), read only memory (ROM), a data object, etc. Moreover, memory 112 (and database 120) may reside at a single physical location comprising one or more types of data storage, or be distributed across a plurality of physical systems. PU 114 may likewise comprise a single processing unit, or a plurality of processing units distributed across one or more locations. I/O 116 may comprise any known type of input/output device including a network system, modem, keyboard, mouse, scanner, voice recognition system, CRT, printer, disc drives, etc. Additional components, such as cache memory, communication systems, system software, etc., may also be incorporated into system 100.

As shown in FIG. 2, program product 122 may include a first measurer 140, a measurement adjuster 142, a comparator 144, a feed forward controller 146, a second measurer 148, a deviation origin determinator 150, a deviation adjuster 152 and other system components 154. Other system components 154 include any functionality necessary for carrying out the teachings of the invention not expressly describe herein. The function of the other components will become apparent in the description that follows.

While correction system 100 has been illustrated as a separate system apart from the other parts of environment 10 (FIG. 1), e.g., processing tool 12, controller 14, FECS 16, it should be recognized that components of correction system 100 can be located in practically any of the abovementioned environment 10 parts. In addition, parts of correction system 100 can be implemented in one of the parts or a combination of the parts of environment 10. Accordingly, the invention should not be limited to any particular physical location.

IV. Operational Methodology

The invention will be described relative to the above-described compartmentalization in which designated components carry out stated functions. It should be recognized, however, that the functions described may be performed by any component of environment 10 (FIG. 1) and that the particular component-function designations are for description purposes only.

Figure 3:
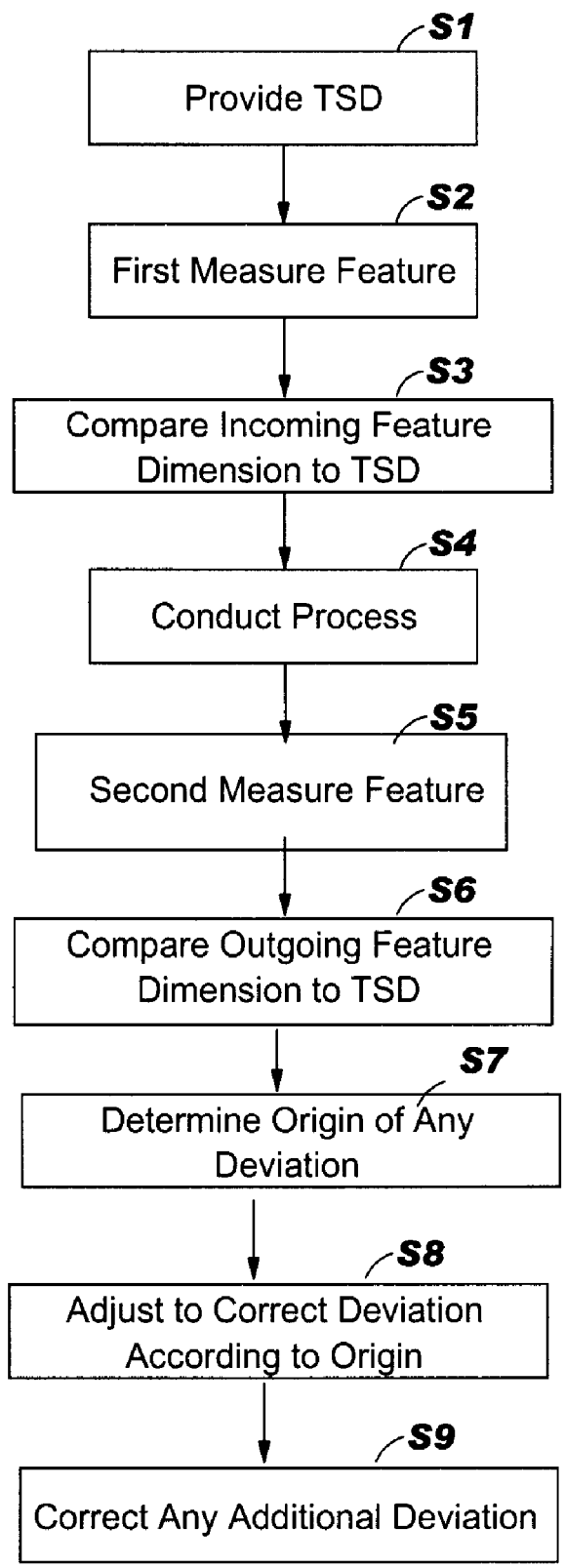
FIG. 3 shows a flow diagram of operational methodology of the system of FIG. 2.

Referring to FIG. 3, a flow diagram of one embodiment of an operational method of the invention will now be described as a wafer moving through environment 10 (FIG. 1). Description will be made relative to FIG. 3 in conjunction with FIGS. 1 and 2.

In a first step S1, a target structure dimension (TSD) is provided for a feature of a wafer. TSD may be provided in any now known or later developed fashion. For example, TSD may be input by a user using a GUI of processing tool 12, controller 14 and/or FECS 16 (FIG. 1).

Next, a wafer coming into processing tool 12 (FIG. 1) is first placed on in an integrated metrology (IM) tool. IM tool may be BPIM 20 where two IM tools or provided or a single IM tool of processing tool 12 where only one is provided. Only the embodiment where two IM tools are provided will be described hereafter. In second step S2, a first measurement of a desired feature of the wafer is conducted by BPIM 20 prior to conducting a process (step S4) relative to the feature to obtain an incoming feature dimension. BPIM 20 is controlled by a first measurer 140, which may be provided as part of correction system 100, or as a part of BPIM 20 that interacts with the rest of correction system 100. Step S2 may also include conversion of the raw data measured by first measurer 140 to establish an incoming feature dimension.

Step S2 may also include a measurement adjuster 142 making adjustments to the measured incoming feature dimension to address at least one of: any calibration adjustments necessary on BPIM 20 hardware and any external reference system, and incoming wafer state deviations that are not addressed by first measurer 140. The adjustments may be permanent, e.g., for calibration adjustments, or temporary, e.g., for incoming wafer state deviations.

In step S3, the incoming feature dimension, possibly adjusted, is compared to the target structure dimension by comparator 144, producing an output that indicates any deviation. For example, for a CD control system, comparator 144 conducts a simple subtraction from incoming CD from a target final CD (target structure dimension). A deviation indicates that a state change is required on the wafer to produce the target structure dimension. Any required change is fed forward by feed forward controller 146 to processing tool 12 as a process model adjustment 36 (FIG. 1). As will be described in more detail relative to step S4, a process model 34 (FIG. 1) is implemented that includes a process recipe setting needed to achieve the structure having the target structure dimension. A process model adjustment 36 indicates how to adjust a process model 34 to address a deviation.

In step S4, a process is conducted on the wafer at processing tool 12 to achieve the structure having the target structure dimension under control of controller 14. In one embodiment, this step includes implementing a process model 34 (FIG. 1) that includes a process recipe setting needed to achieve the structure having the target structure dimension. Any change in the incoming feature dimension required is fed forward by feed forward controller 146, and is used to modify the process. As noted above, a process model 34 (FIG. 1) can be, for example, a simple linear equation with one input and one output, i.e., a single input, single output (SISO), or a complex mathematical model using many inputs and creating many outputs, i.e., multi input, multi output (MIMO). For an example of a CD control system, a process model converts a desired trim amount to a process recipe setting, i.e., process parameters. Step S4 may also include controller 14 (FIG. 1) forwarding a process model 34 that instructs processing tool 12 how to conduct a particular process, and a process model adjustment 36 that indicates how to adjust a process model 34 when necessary for reasons that will become apparent below. An adjustment in the recipe setting as determined by process model 34 that is fed forward (based on the incoming feature dimension measurement at step S3) to produce the desired target structure dimension can be on a wafer-to-wafer time cycle or held constant for a complete lot. In addition, if an error is measured later in the outgoing feature dimension and the origin is attributed to the process, then process model 34 (FIG. 1) can be adjusted to address this problem, as will become apparent below.

In step S5, a second measurement of the feature is conducted by APIM 22 (FIGS. 1 and 2) after conducting the process (step S4) relative to the feature. APIM 22 is controlled by a second measurer 148, which may be provided as part of correction system 100, or as a part of APIM 22 that interacts with the rest of correction system 100. As with the first measurement (step S2), step S5 may also include conversion (under action of measurement model 38 (FIG. 1)) of the raw data measured by second measurer 148 to establish an outgoing feature dimension. Furthermore, step S5 may also include measurement adjuster 142 making adjustments to an outgoing feature dimension to address at least one of: any calibration adjustments necessary on APIM 22 hardware and any external reference system, and any outgoing wafer state deviations that are not addressed by second measurer 148. The adjustments may be permanent, e.g., for calibration adjustments, or temporary, e.g., for incoming wafer state deviations.

As illustrated, the invention includes a first measurer 140 and a second measurer 148 to address those situations where two different IM tools 20, 22 are provided on a processing tool 12. Where only one IM tool is provided or deviations between BPIM 20 and APIM 22 are minimal, it may be possible to provide only one measurer 140, 148.

In step S6, the outgoing feature dimension, possibly adjusted, is compared to the target structure dimension by comparator 144, producing an output that indicates any deviation. A deviation at this stage may indicate a number of situations. First, it may indicate that APIM 22 has been affected by upstream processes. Metrology deviations might come from hardware replacement or differences between metrology tools. Second, it may indicate that process model 34 is inadequate to attain the target structure dimension and that an adjustment of process model 34 by a process model adjustment 36 is required. This may be the case, for example, where the process chamber of processing tool 12 has changed in some fashion, e.g., after cleaning, or where the process itself accidentally varies. Finally, it may also indicate that some upstream processing is causing an error such as wafer state deviations, which may affect BPIM 20 or which cause another discrepancy between the incoming feature dimension and the masking feature dimensions. Deviations in incoming wafer state can come from product differences, material changes, previous process equipment deviations in processing, and across wafer uniformity changes. Changes in wafer state can directly impact the measurement or can cause a difference between the incoming feature dimension and the masking feature dimension. In any case, it is important to separate process equipment deviations, wafer state properties deviations and metrology deviations so that the correct adjustment can be made.

In order to address this problem, at step S7, an origin of any deviation of the outgoing feature dimension from the target dimension is determined by deviation origin determinator 150. That is, correction system 100 decides what part of environment 10 (FIG. 1) needs to change to correct for the difference. The deviation origin determination can take a variety of modes, as will be describe in the following section.

In step S8, once the origin of a deviation is determined, deviation adjuster 152 adjusts, according to the origin, at least one of: 1) BPIM 20 by generating a measurement model adjustment 40 that adjusts a measurement model 38 therefore, 2) APIM 22 by generating a measurement model adjustment 40 that adjusts a measurement model 38 therefore, 3) processing tool 12 via a process model adjustment 36 that adjusts process model 34, 4) any other upstream processing tool or measurement tool in a similar fashion as 1)-3), and/or 5) any combination of the above, to correct for any deviation. Hence, the outgoing feature dimension is used to determine a deviation, and corrective measures may be fed back to correct not just processing tool 12, but any other equipment, process or wafer state.

At this point in processing, any correction that can be applied at this particular process station has been completed. However, at step S9, if further deviations in each lot processed continue to occur, by the process of elimination, the deviations are known to be coming from upstream processes that change the wafer state thus impacting the BPIM measurement or impacting how the process in process chamber 18 (FIG. 1) acts upon the measured feature to produce the outgoing feature. In this case, for each lot any additional deviations are corrected by feeding back (via link 30 (FIG. 1)) data to upstream processes. In this case, at least within each lot, further variations wafer-to-wafer in the incoming feature dimension may be compensated by feeding forward a process model adjustment 36 so that process model 34 can select the appropriate reaction condition to achieve the target structure dimension. When the next lot comes along, it may require a different correction Within this new lot, further variations wafer-to-wafer in the incoming feature dimension are compensated by feeding forward a process model adjustment 36 to address the deviation between the incoming measurement and the target into the process model which selects the appropriate reaction condition to achieve the final target. At some point the correction required may become large enough that system 100 or a user thereof, may suspect something else is drifting, in which case the full origin determination can be repeated. Alternatively, the origin determination can be run periodically. Additional partitioning to determine the origin of a deviation can occur, for example, by using a MRW to examine the BPIM or by examining upstream equipment to find changes such as layer thicknesses or feature sidewall slopes, but it is not necessary to determine the origin in order to achieve maximum correction of the incoming wafers and to achieve results as close as possible to the final target.

Figure 4:
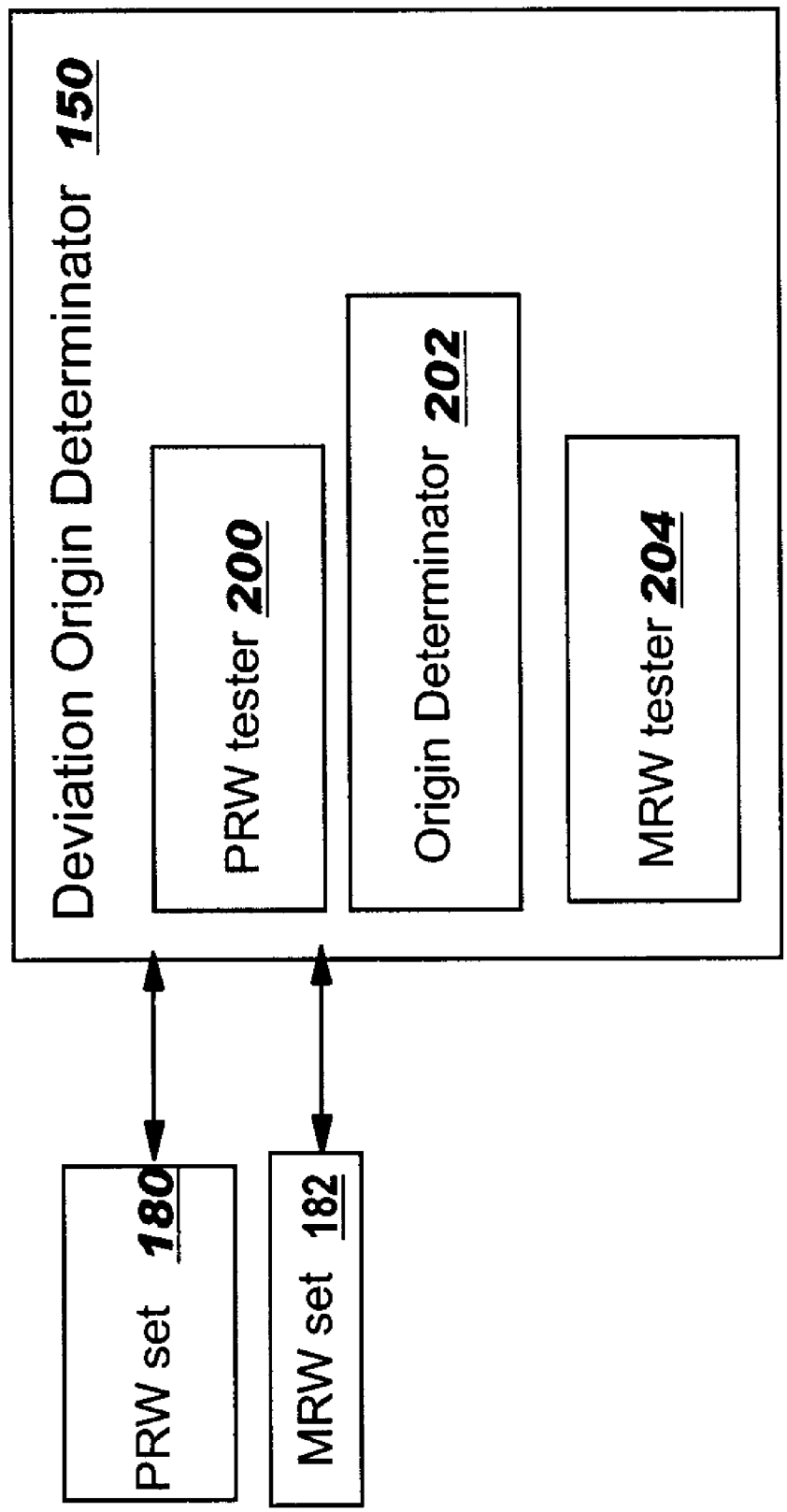
FIG. 4 shows an illustrative block diagram of a deviation origin determinator in accordance with an embodiment of the present invention.

V. Determination of Deviation Origin:

As noted above, the deviation origin determination can take a variety of modes, which will now be described in more detail. Referring to FIG. 4, a block diagram illustrating details of deviation origin determinator 150 is shown. In one embodiment, deviation origin determinator 150 includes: a process reference wafer (PRW) tester 200, an origin determinator 202 and a measurement reference wafer (MRW) tester 204.

A first mode is referred to herein as a "process reference wafer" mode. In this mode, a set of process reference wafers 180 are generated. In one embodiment, a process reference wafer set includes a set of one of: patterned wafers and blanket wafers. The "process reference wafer" (hereinafter "PRW") set is generated together, i.e., each PRW is created on the same tool set and at the same time as the other PRWs of a set. As a result, the PRW set provides a long-term reference or baseline for a feature dimension for determining an origin of a deviation, as will be described below. A desired feature of each PRW is measured to generate a "PRW incoming feature dimension" baseline. This value is stored for later reference. In order to fully characterize the PRW set relative to a given process, at least one PRW is run through the process at a first point in time to arrive at an "expected PRW outgoing feature dimension" for the PRW set, which is determined by measuring the feature. If more than one PRW is run, an average may be used. At this point, a "baseline reference" including an incoming and outgoing PRW feature dimension for a PRW set for the given process is known.

Figure 5:
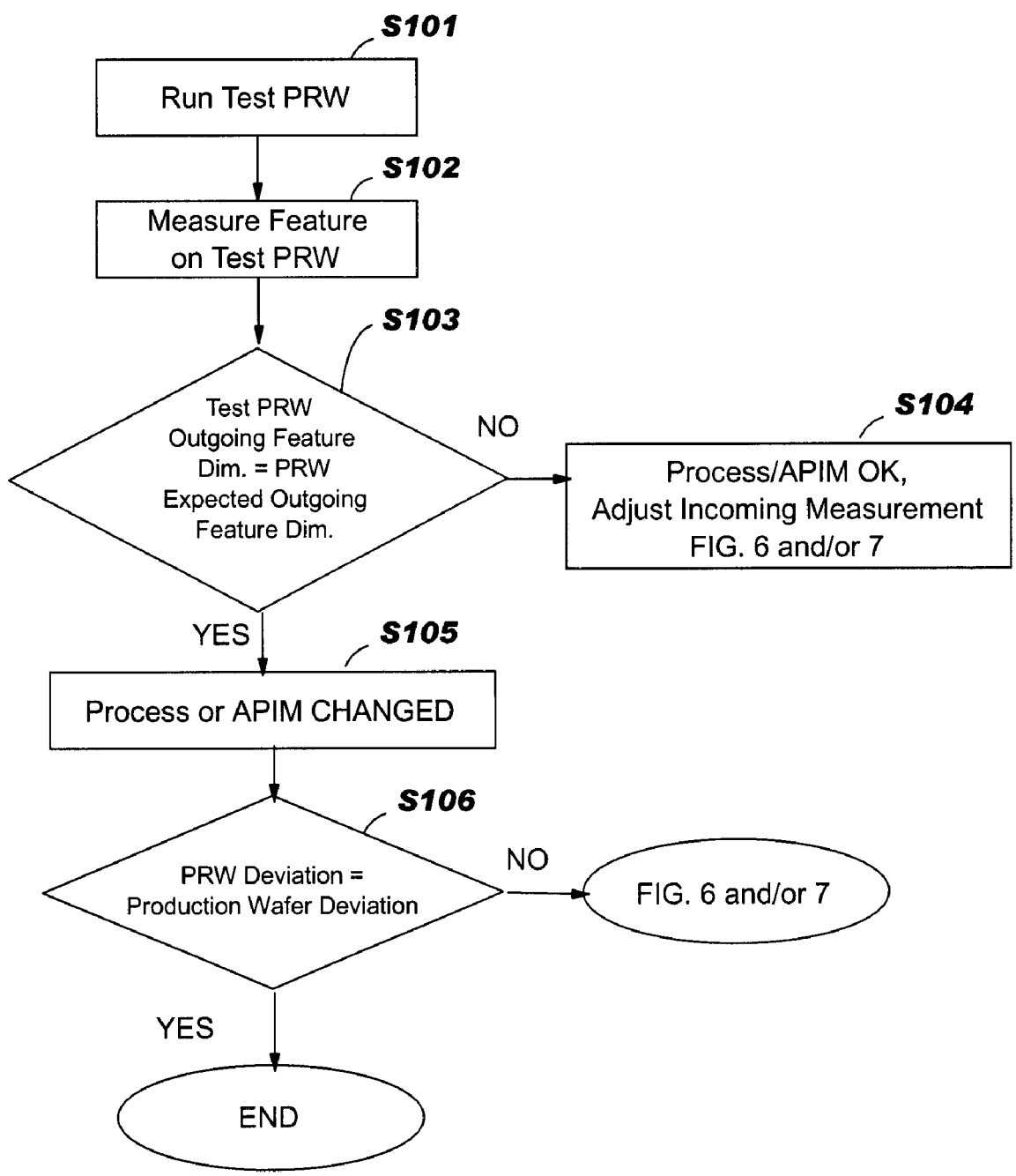
FIG. 5 shows a flow diagram of operational methodology of a first mode of a deviation origin determinator of FIG. 2.

Turning to FIG. 5, a flow diagram of operation of deviation origin determinator 150 (FIG. 2) in the PRW mode will now be described. The PRW mode may be entered into periodically (perhaps prior to processing of a production wafer lot) or in the event that a deviation, above a certain threshold limit, is determined to exist in a "production wafer," i.e., one meant for actual use, after processing (step S6 of FIG. 3).

In either case, deviation origin determinator 150, in the PRW mode, operates to determine the origin of the deviation as follows:

In first step S101 of FIG. 5, determinator 150 via PRW tester 200 directs running another one of the PRW set, which has not been through the process before. This PRW is referred to herein as the "test PRW," and the running occurs at a second, later point in time compared to the first point in time. Once complete, at step S102, a test PRW outgoing feature dimension for the identical feature on the baseline PRW is measured on the test PRW by APIM 22 under control of PRW tester 200. At step S103, the test PRW outgoing feature dimension is compared to the expected PRW outgoing feature dimension (based on the stored incoming measurement) for the PRW set by comparator 144 to determine whether a deviation exists. If there is no deviation between the test PRW outgoing feature dimension and the expected PRW outgoing feature dimension, i.e., NO at step S103, then a deviation determination by origin determinator 202 is that neither the process nor APIM 22 is the cause of the deviation, i.e., "process and APIM OK, adjust incoming measurement" at step S104. In other words, since application of the given process to the test PRW resulted in the expected PRW outgoing feature dimension, then the process and the APIM measurement are still generating what is expected and have not changed. In this case, the origin of the deviation must be because the incoming measurement needs adjustment, e.g., an upstream deviation or an IM tool deviation is the origin of the deviation. For example, if the measured dimension is a CD, then the incoming feature dimension does not match the masking feature dimension. In this event, in one embodiment, deviation origin determinator 150 (FIG. 2) would instruct deviation adjuster 152 to adjust the incoming measurement. That is, deviation origin determinator 150 (FIG. 2) adjusts the incoming measurement by directing deviation adjuster 152 (FIG. 1) to generate a measurement model adjustment 40 to change measurement model 38 by which BPIM 20 takes raw measurement data and converts it to a measured dimension. Such an adjustment could be sufficient to completely minimize deviation of processed "production wafers" from a target dimension. If the dimension is a CD, then the adjustment would make the incoming feature dimension and masking feature dimension coordinate. In addition to the above-described adjustment embodiment or in replacement thereof, it may also be desirable to proceed with other analysis to further determine the origin, as will be described below relative to FIGS. 6-7. This further processing addressed the chance that an error in APIM 22 measurement is exactly balanced by an error in the process, although this situation is vanishingly small.

If there is a deviation of the test PRW outgoing feature dimension and the expected PRW outgoing feature dimension, i.e., YES at step S103, then a deviation determination by origin determinator 202 is that the process or APIM 22 is the cause, i.e., "process or APIM CHANGED" at step S105. In this latter case, further analysis (FIGS. 6-7) can determine if the deviation is from APIM 22 or the process. As will be described further below, if the deviation is shown to be from the process by the "measurement reference wafer mode," described below, then deviation adjuster 152 (FIG. 1) is directed create an appropriate process model adjustment 36 for process model 34 (FIG. 1) for the process, i.e., at step S8 of FIG. 3. If the deviation is shown to be from APIM 22, then the deviation adjuster 152 is directed to create an appropriate measurement model adjustment 40 for APIM 22. If the deviation is shown to be from a combination of APIM 22, and the process, then deviation adjuster 152 adjusts each according to its contribution to the deviation.

Figure 6:
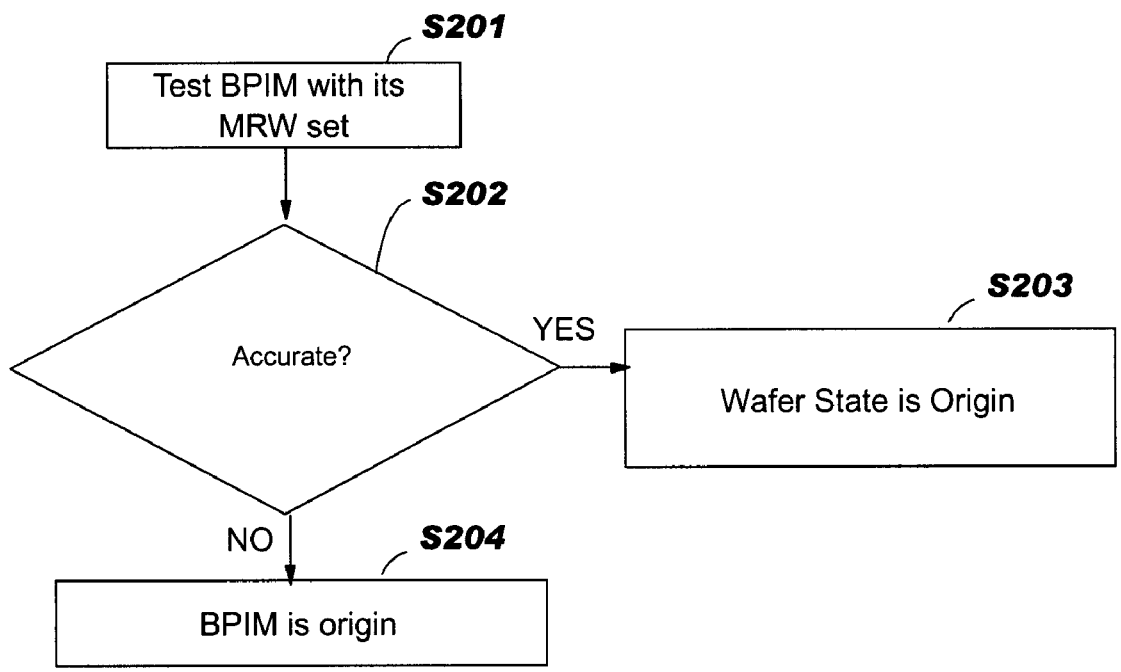
FIG. 6 shows a flow diagram of operational methodology of a second mode of a deviation origin determinator of FIG. 2.

As an optional step S105, in the case that the PRW mode is entered into in response to a production wafer outgoing feature dimension deviating from the target structure dimension, deviation origin determinator 150 (FIG. 2) may determine whether a PRW deviation (from step S103) is equal to a production wafer deviation, at step S106, using comparator 144. That is, whether the amount that the test PRW deviated from the expected result is the same as the deviation of the production wafer from the target structure dimension is determined. If the values are equal, deviation origin determinator 150 (FIG. 2) via origin determinator 202 concludes that the process is the only origin of the deviation, and logic then ends. Alternatively, if the values are not equal, deviation origin determinator 150 (FIG. 2) via origin determinator 202 concludes that the origin may be the process plus some other thing, e.g., BPIM 20, upstream processing, etc. In this case, processing may proceed with further analysis as indicated in FIGS. 6 and/or 7, as will be described below.

Figure 7:
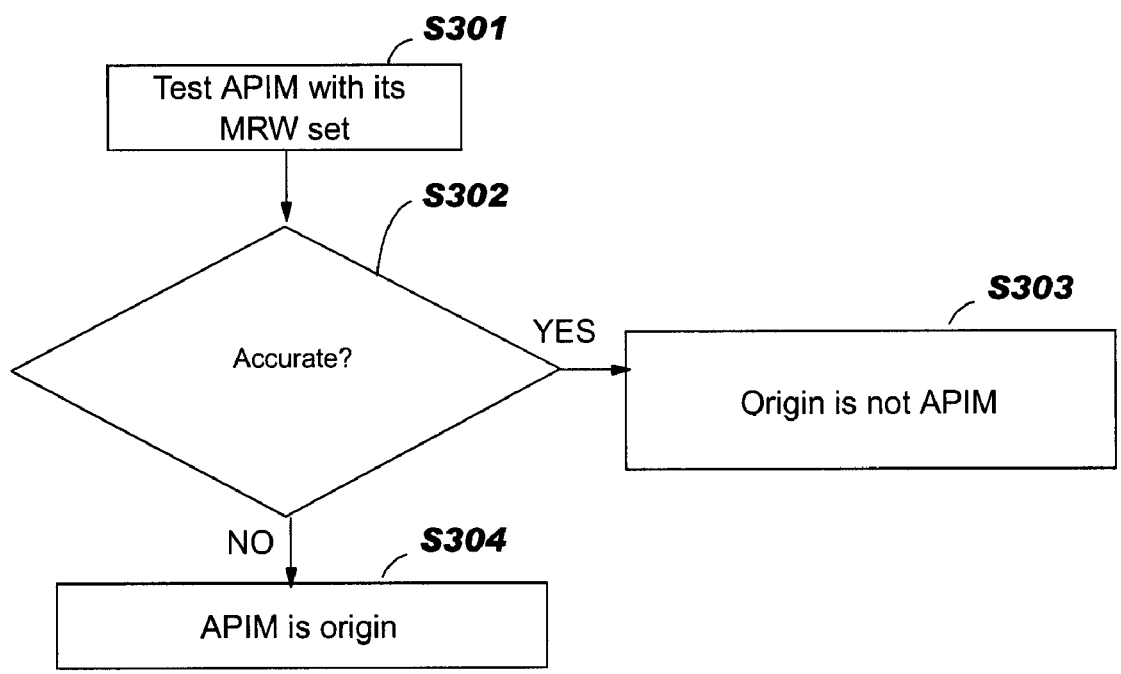
FIG. 7 shows a flow diagram of operational methodology of a third mode of a deviation origin determinator of FIG. 2.

A second mode is referred to herein as a "measurement reference wafer" (MRW) mode. Flow diagrams of this mode are illustrated in FIGS. 6-7. In this mode, a set of measurement reference wafers are generated for each integrated metrology tool, i.e., BPIM 20 and APIM 22 (FIG. 1). Each "measurement reference wafer" (hereinafter "MRW") has a relevant feature measured by a respective IM tool to provide a "measurement baseline," which provides a long-term reference or baseline for a feature dimension for determining an origin of a deviation, as will be described below. This value is stored for later reference. This mode may be initiated periodically or when other modes, i.e., the PRW mode, determines that it should be initiated. For example, at step S104 of FIG. 5, in which the origin is determined to be other than the process, deviation origin determinator 150 may initiate the MRW mode. In the MRW mode, deviation origin determinator 150 operates to determine the origin of the deviation as follows: In step S201, the BPIM 20 is tested using the respective MRW set by a MRW tester 204 of deviation origin determinator 150. At step S202, a determination is made as to whether the measurement is accurate by comparing results of the measurement test versus the measurement baseline for BPIM 20 for the same feature using comparator 144. If YES at step S202, deviation origin determinator 150 via origin determinator 202 concludes that the wafer state is the origin of the deviation at step S203, and deviation adjuster 152 (FIG. 2) makes an appropriate adjustment. For example, deviation adjuster 152 may direct correction system 100 to test upstream equipment or processes. If NO at step S202, then deviation origin determinator 150 via origin determinator 202 concludes that it is BPIM 20 that is the origin of the deviation, and deviation adjuster 152 (FIG. 2) generates an appropriate measurement adjustment 40 for measurement model 36 for BPIM 20, which converts raw data into a measured dimension, at step S204.

Alternatively or in combination, APIM 20 may also be tested, as shown in FIG. 7. In step S301, APIM 22 is tested using the respective MRW set by MRW tester 204. At step S302, results of the measurement test versus the measurement baseline for APIM 22 for the same feature are compared using comparator 144. If YES at step S302, deviation origin determinator 150 via origin determinator 202 concludes that APIM 22 is not the origin at step S303, and deviation origin determinator 150 directs analysis of some other upstream processing tools. If NO at step S302, then deviation origin determinator 150 concludes that it APIM 22 is the origin, and deviation adjuster 152 (FIG. 2) generates an appropriate measurement model adjustment 40 for measurement model 36 for APIM 22, at step S304.

In addition to the above-described processing for IM tool testing, it may also be advantageous to conduct periodic testing versus an external reference system, e.g., a CD SEM.

It should be recognized that each type of reference wafer might take a variety of forms. For example, reference wafers may be replicas of the wafers used in the actual production wafers, but may also be other sorts of wafers. For example, if an incoming wafer has a silicon dioxide pattern of a certain CD, and the process used to trim the feature to the correct masking feature dimension is a chemical oxide removal (COR) process, then a reference wafer used as the below-described process reference wafer may use a blanket TEOS instead of a patterned wafer as a PRW. A COR process uses a gaseous mixture of hydrofluoric acid (HF) and ammonia ($NH_3$) to etch the silicon dioxide. Etching of a blanket wafer is closely correlated with the lateral trim of a patterned feature. Therefore, it would be advantageous to use a blanket wafer instead of a patterned wafer to characterize the process.

VI. Miscellany

Adjustments (i.e., corrections) and how they are fed back to a process model 34 and/or a measurement model 38 can take many forms. In one embodiment, a correction is implemented as a simple shift of the measurement/process model by a constant, which is the dictated by the deviation. With regard to measurement model adjustments, another way is to use PRWs and MRWs that contain an array of dimensions such that the behavior of an array of dimensions is determined when the PRW or MRW is run through the procedure to determine the origin of the deviation. Then, a correction that is dependent on the initial size of the dimension can be made. For instance, a correction that is of the form "correction value=mx+b" could be applied where x is the initial dimension and the values of m and b are determined by running PRW, MRW, or production wafers. Alternatively even more complex equations dependent upon not only the initial dimension, but also related dimensions might be applied. In view of the foregoing, the form of corrections applied is not limited.

The above-described invention also provides improvements relative to the timescale over which corrections are applied to the measurement models or process models. In particular, as noted above, prior art feedback corrections are generally applied on a L2L basis with wafers within the lot all receiving the same correction. Since upstream processes often drift gradually, the correction of incoming lots from a defined thread of tools is equal to an EMWA of the lot deviation. It can be difficult to track and control these threads. With wafer-to-wafer measurements such an EWMA based feedback is no longer optimum. According to the invention, however, the feedback for the first wafer of each lot is reset to zero, with a feedback correction for the remaining wafers that changes by the cumulative average of the applied correction plus the measured deviation. In a more complex alternative, instead of resetting the initial correction for each lot, it is possible to devise a hybrid of the prior art, by lot, EWMA method that provides an initial guess for the applied correction and then modifies that correction by the cumulative average described above.

VII. Conclusion:

The foregoing invention can use a feed-forward correction to correct W2W deviations while simultaneously using feedback corrections to correct any drift in lot average. Furthermore, the errors are correctly attributed to their origin on a timescale, which minimizes the errors when processing production wafers. The methods can be carried out on at lease one of: a wafer-by-wafer (W2W) basis; a lot-by-lot (L2L) basis; a with-in-wafer (WIW) basis; and a with-in-die (WID) basis.

In the previous discussion, it will be understood that the method steps discussed are performed by a processor, such as PU 114 of system 100, executing instructions of program product 122 stored in memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While this invention has been described in conjunction with the specific embodiments outlined above, it is evident that many alternatives, modifications and deviations will be apparent to those skilled in the art. Accordingly, the embodiments of the invention as set forth above are intended to be illustrative, not limiting. Various changes may be made without departing from the spirit and scope of the invention as defined in the following claims.

The invention claimed is:

1. A method for correcting a deviation of a dimension of a feature from a target in a semiconductor process, the method comprising the steps of:
   first measuring the feature prior to conducting a process relative to the feature to obtain an incoming feature dimension;
   conducting the process based on a process model;
   second measuring the feature after conducting the process to obtain an outgoing feature dimension;
   determining an origin of any deviation of the outgoing feature dimension from a target structure dimension, wherein the determining includes:
      conducting the process on a first process reference wafer of a process reference wafer set, each process reference wafer of the set having been generated at a first point in time;
      establishing a baseline outgoing feature dimension of the feature from the first process reference wafer at the first point in time;
      conducting the process on a second process reference wafer of the process reference wafer set at a later second point in time;
      measuring an outgoing feature dimension of the feature on the second process reference wafer; and
      determining whether a deviation exists between the baseline outgoing feature dimension and the outgoing feature dimension of the second process reference wafer; and
   adjusting, according to the origin, at least one of the measuring steps and the process conducting step to correct for any deviation.

2. The method of claim 1, wherein the method is carried out on at least one of: a wafer-by-wafer (W2W) basis; a lot-by-lot (L2L) basis; a with-in-wafer (WIW) basis; and a with-in-die (WID) basis.

3. The method of claim 1, wherein the determining step includes
   in the case that a deviation exist, determining that the origin is the first measuring step, and in the case that a deviation does not exist, determining that the origin is at least one of the processing step and the first measuring step.

4. The method of claim 3, wherein in the case that a deviation exists, further determining whether the deviation is equivalent to a production wafer deviation generated on a production wafer.

5. The method of claim 4, further comprising the step of providing a measurement reference wafer set for each measurement tool used to conduct the measuring steps and a measurement baseline for the measurement reference set; and
   wherein in the case that the deviations are not equivalent, conducting a measurement test of at least one measuring tool used to conduct at least one of the measuring steps, and comparing results of the measurement test versus the measurement baseline for that measurement tool to determine whether an inaccuracy exist.

6. The method of claim 5, wherein in the case that an inaccuracy exists in a measurement tool for the first measuring step, determining that the origin is that measurement tool, otherwise determining the origin is a state of an incoming wafer; and
   wherein in the case that an inaccuracy exists in a measurement tool for the second measuring step, determining that the origin is that measurement tool, otherwise excluding that measurement tool as the origin.

7. The method of claim 1, wherein at least one of the first and second measuring steps includes adjusting a respective feature dimension to address at least one of: a calibration adjustment and a wafer state deviation.

8. The method of claim 1, further comprising the step of feeding forward a process model adjustment to the process conducting step for the process model to address any deviation of the first measurement from the target structure dimension based on the first measurement.

9. The method of claim 1, wherein the process model includes a process recipe setting needed to achieve the target dimension from the incoming feature dimension.

10. The method of claim 1, wherein the measuring steps are carried out using a standalone metrology tool.

11. A system for correcting a deviation of a dimension of a feature from a target in a semiconductor process, the system comprising:
   means for first measuring the feature prior to conducting a process relative to the feature to obtain an incoming feature dimension;
   means for conducting the process based on a process model;
   means for second measuring the feature after conducting the process to obtain an outgoing feature dimension;
   means for determining an origin of any deviation of the outgoing feature dimension from a target structure dimension, wherein the determining means includes means for determining whether a deviation exists between a baseline outgoing feature dimension of a first process reference wafer that has been run through the process conducting means at a first point in time, and an outgoing feature dimension of a second process reference wafer of the process reference wafer set that has been run through the process conducting means at a later second point in time; and
   means for adjusting, according to the origin, at least one of the measuring means and the process conducting means to correct for any deviation.

12. The system of claim 11, further comprising a process reference wafer set including a plurality of process reference wafers that have been generated together, the process reference set including the first process reference wafer that has been run through the process conducting means at the first point in time, and the baseline outgoing feature dimension of the feature from the first process reference wafer has been established at the first point in time.

13. The system of claim 12, wherein the determining means includes
   means for determining that the origin is the first measuring means in the case that a deviation exist, and determining that the origin is at least one of the process conducting means and the first measuring means in the case that a deviation does not exist.

14. The system of claim 13, wherein each process reference wafer set includes a set of one of: patterned wafers and blanket wafers.

15. The system of claim 13, wherein in the case that a deviation exists, the determining means further determines whether the deviation is equivalent to a deviation generated on a production wafer.

16. The system of claim 15, further comprising a measurement reference wafer set for each measurement means including a measurement baseline; and
   wherein in the case that the deviations are not equivalent, the determining means further conducts a measurement test of at least one measuring means, and compares results of the measurement test versus the measurement baseline for that measuring means to determine whether an inaccuracy exist.

17. The system of claim 16, wherein in the case that an inaccuracy exists in the first measuring means, the determining means determines that the origin is the first measuring means, and in the case that an inaccuracy does not exist in the first measuring means, determines the origin is a state of an incoming wafer; and
   wherein in the case that an inaccuracy exists in the second measuring means, the determining means determines that the origin is the second measuring means, and in the case that an inaccuracy does not exist in the second measuring means, excludes the second measuring means as the origin.

18. The system of claim 11, further comprising means for feeding forward a process model adjustment to the process conducting means for the process model to address any deviation of the first measurement from the target structure dimension based on the first measurement.

19. The system of claim 11, wherein the process model includes a process recipe setting needed to achieve the target structure dimension from the incoming feature dimension.

20. The system of claim 11, wherein the system is applied on at least one of: a wafer-by-wafer (W2W) basis; a lot-by-lot (L2L) basis; a with-in-wafer (WIW) basis; and a with-in-die (WID) basis.

21. The system of claim 11, wherein at least one of the measuring means includes a standalone metrology tool.

22. A computer program product comprising a computer useable medium having computer readable program code embodied therein for correcting a deviation of a dimension of a feature from a target in a semiconductor process, the program product comprising:
   program code configured to control means for first measuring the feature prior to conducting a process relative to the feature to obtain an incoming feature dimension;
   program code configured to control a processing tool that conducts the process based on a process model;
   program code configured to control means for second measuring the feature after conducting the process to obtain an outgoing feature dimension;
   program code configured to determine an origin of any deviation of the outgoing feature dimension from a target structure dimension, wherein the determining code includes program code for determining whether a deviation exists between a baseline outgoing feature dimension of a first process reference wafer that has been run through the process conducting means at a first point in time, and an outgoing feature dimension of a second process reference wafer of the process reference wafer set that has been run through the process conducting means at a later second point in time; and
   program code configured to generate an adjustment, according to the origin, for at least one of the measuring means and the processing tool to correct for any deviation.

23. The program product of claim 22, further comprising a process reference wafer set including a plurality of process reference wafers that have been generated together, the process reference set including the first process reference wafer that has been run through the process conducting means at the first point in time, and the baseline outgoing feature dimension of the feature from the first process reference wafer has been established at the first point in time.

24. The program product of claim 23, wherein the determining code includes
program code configured to determine that the origin is the first measuring means in the case that a deviation exist, and determine that the origin is at least one of the processing means and the first measuring means in the case that a deviation does not exist.

25. The program product of claim 24, wherein in the case that a deviation exists, the determining code further determines whether the deviation is equivalent to a production wafer deviation generated on a production wafer.

26. The program product of claim 25, further comprising a measurement reference wafer set for each measuring means including a measurement baseline; and
wherein in the case that the deviations are not equivalent, the determining code further conducts a measurement test of at least one of the measuring means, and compares results of the measurement test versus the measurement baseline for that measuring means to determine whether an inaccuracy exist.

27. The program product of claim 26, wherein in the case that an inaccuracy exists in the first measuring means, the determining code determines that the origin is the first measuring means, and in the case that an inaccuracy does not exist in the first measuring means, determines the origin is a state of an incoming wafer; and
wherein in the case that an inaccuracy exists in the second measuring means, the determining code determines that the origin is the second measuring means, and in the case that an inaccuracy does not exist in the second measuring means, excludes the second measuring means as the origin.

28. The program product of claim 22, further comprising program code configured to feed forward a process model adjustment to the process conducting program code for the process model to address any deviation of the first measurement from the target structure dimension based on the first measurement.

29. The program product of claim 22, wherein the process model includes a process recipe setting needed to achieve the target structure dimension from the incoming feature dimension.

30. The program product of claim 22, wherein at least one of the measuring means includes a standalone metrology tool.

* * * * *